United States Patent [19]
Zimmer

[11] Patent Number: 4,997,122
[45] Date of Patent: Mar. 5, 1991

[54] SOLDER SHAPING PROCESS

[75] Inventor: Gero Zimmer, Rolling Hills Estates, Calif.

[73] Assignee: Productech Inc., Rolling Hills Estates, Calif.

[21] Appl. No.: 382,850

[22] Filed: Jul. 20, 1989

[30] Foreign Application Priority Data

Jul. 21, 1988 [DE] Fed. Rep. of Germany ....... 3824865

[51] Int. Cl.[5] .......................... B23K 1/20; B23K 31/02; B23K 33/00
[52] U.S. Cl. .................................... 228/165; 228/174; 228/203; 228/246
[58] Field of Search ...................... 228/180.2, 179, 165, 228/173.1, 173.2, 174, 203, 246, 15.1, 19, 51, 55, 56.3, 1.1, 4.5, 223; 219/229

[56] References Cited

U.S. PATENT DOCUMENTS

| | | | |
|---|---|---|---|
| 3,373,481 | 3/1968 | Lins et al. | 228/180.2 |
| 3,387,365 | 6/1968 | Stelmak | 228/180.2 |
| 3,589,000 | 6/1971 | Galli | 228/180.2 |
| 3,750,265 | 8/1973 | Cushman | 228/180.2 |
| 4,750,666 | 6/1988 | Neugebauer et al. | 228/4.5 |
| 4,752,027 | 6/1988 | Gschwend | 228/180.2 |
| 4,836,435 | 6/1989 | Napp et al. | 228/180.2 |
| 4,857,671 | 8/1989 | Nakano et al. | 228/180.2 |
| 4,872,604 | 10/1989 | Zimmer | 228/51 |

FOREIGN PATENT DOCUMENTS

990458 1/1983 U.S.S.R. .............................. 228/1.1

OTHER PUBLICATIONS

IBM Technical Disclosure Bulletin, "Serrated, Flattened Pad . . . ", vol. 9, No. 11, p. 1653, Apr. 1967.
Western Electric, ". . . Wire Bonding Tip", Technical Digest, No. 20, p. 7, Oct. 1970.

*Primary Examiner*—Sam Heinrich
*Attorney, Agent, or Firm*—Notaro & Michalos

[57] ABSTRACT

A process for treating the surface of solid fusible solder supported on a substrate, comprises a heated tool having a treatment surface with a selected shape. The heated tool is brought into contact with the solder for fusing the solder to reshape the surface of the solder. The tool is allowed to cool to permit the solder to resolidify, and when withdrawn from the solder, leaving the imprinted shape. The treatment surface is made of material which is not wettable by the solder. Stops may be utilized for limiting movement between the tool and the substrate to a specified gap for the treatment surface.

20 Claims, 5 Drawing Sheets

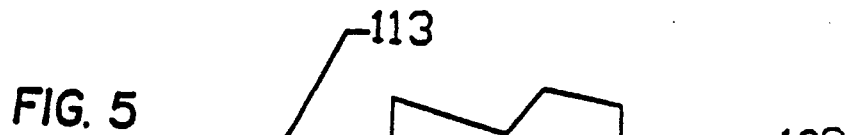
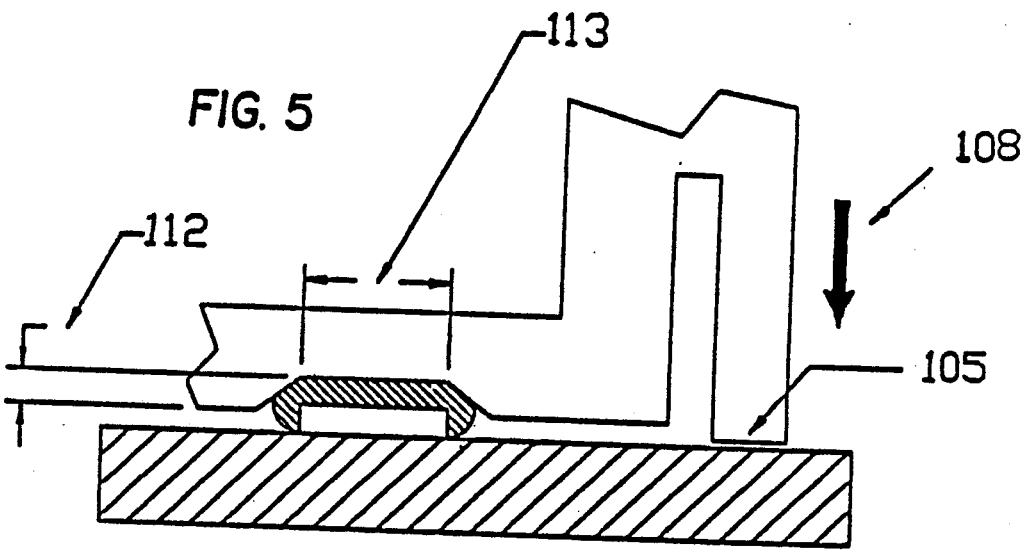
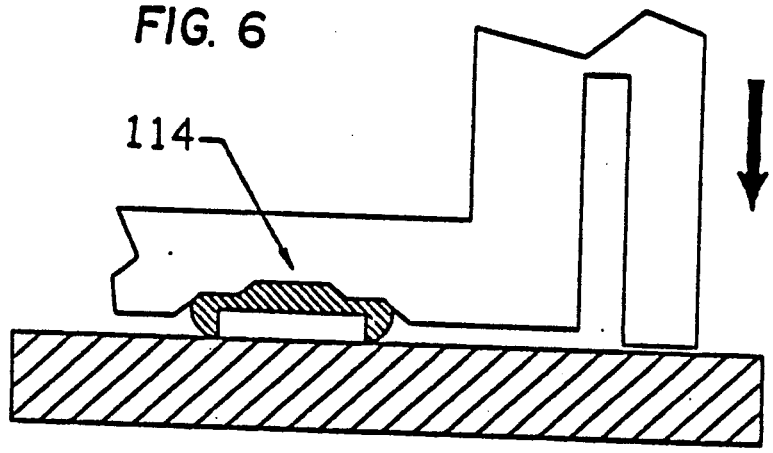

SOLDER SHAPING PROCESS

FIELD AND BACKGROUND OF THE INVENTION

The present invention relates in general to the treatment of fusible materials such as solder, and in particular to a new and useful process for treating the surface of solid fusible material.

In the manufacturing of electronic equipment, components are usually mounted to circuit boards by soldering. It has been known for many years to supply the required solder during a soldering process from a reservoir containing liquid solder. Liquid solder is available from the reservoir in large amounts and is supplied using known techniques such as in a liquid wave.

Usually different techniques are required for supplying different amounts of solder for connecting the various components to a board. One typical example is the supplying of solder in the form of a paste which is printed to cover defined areas of the board. The three dimensional shape or height of the solder determines the volume of solder at any particular location on the board.

It is critical to supply the correct amount of solder within a specified tolerance, particularly for areas which will not tolerate excess solder. One such situation is where flat ribbons acting as conductors from a typical flatpack component is to be solder mounted to flat conductors on the board with almost 100% coverage. If too much solder is present, the solder will bridge adjacent conductors and form a short circuit.

If too little solder is available an imperfect solder joint will result. Standard procedures for placing solder create wide ranges of tolerances which are often caused by different shaped pads as well as different components to be mounted to the board.

The required layers of solders can also be plated to pads on the board using a known galvanic process. To maintain high quality in this plated solder, the solder is usually fused in a separate thermal process prior to the mounting process. These processes are performed over the entire board. This creates a wide range of tolerances. Other known processes for solder plating also create wide ranges of tolerances which often cannot be accepted for manufacturing purposes. Another disadvantage of such processes is that once the solder on the pad fuses, it loses its flat shape and becomes rounded due to surface tension of the liquid solder. In particular with small dimensions, it is very difficult to position leads of a component on such non-flat surfaces because the leads may easily move to the sides of the rounded shapes. This may move the entire component from its desired location and create electrical short circuits. There is currently almost no known procedure which reduces the wide range of tolerances in the solder provided on circuit boards. This effects the entire yield during the manufacturing process which usually requires excessive reworking of unacceptable parts.

The metallic solder which is used to form a solder joint between two or more metallic parts, must, in its liquid state, form intermetallic phases with the material of the metal parts. This requires the relevant surfaces to be metallically clean. In particular, this means that the parts must be free of oxide layers.

As a practical matter, this requires the application of flux material to reduce contamination at the surfaces. At higher temperatures, fluxes are chemically activated to reduce contamination at the metallic surfaces for improving the joining process. Flux also protects the surfaces for a limited time period during the joining process to avoid contamination by newly formed oxides.

For most applications, it is not easy to supply the correct amount of flux and to keep the flux in the areas it is needed during the joining process. If excessive force is applied to the parts which are to be joined together, the flux may be squeezed out from between the parts leaving very little flux in the areas where it is needed. Further flux generally moves from areas of higher temperature to areas of lower temperature, further frustrating the joining process.

These problems are particularly evident during so called pulsed-hotbar soldering. Pulsed-hotbar soldering uses a tool which is heated by a pulse of energy to join parts which are held against each other by force applied to the heated tool. The squeezing of flux out from the joining area where it is needed is a typical feature of this process such as when flat ribbons of an integrated circuit package are being connected to the pads of a printed circuit. This problem limits the applicability of pulsed-hotbar soldering techniques in this environment.

Some known processes involving brazing with hard solder, supply flux together with the solder in a solid form. The required amount of solder is thus available during the fusing process. Soft soldering processes using tin-solder alloys are also known where the flux is provided inside a solder wire. The solder wire is applied to heated surfaces to be joined while the necessary amount of flux is supplied automatically.

SUMMARY OF THE INVENTION

An object of the present invention is to avoid the above-identified disadvantages by providing a process for treating the surface of a solid fusible material such as solder, using a tool having a treatment surface with a selected shape or contour. The treatment tool may be heated and may be pressed against the surface of the fusible material with a selected force to provide the solder with the selected surface. The treatment surface may be flat and planar for "coining" or flattening the solder. The selected shape of the treatment surface may also have convex projections or concave recesses for reshaping the surface of the solder. Convex projections are used for applying cavities to the surface of the solder. Flux or other materials may then be supplied to these cavities. The flux is thereby retained in the area where it is most needed.

By practicing the present invention, efficiency is increased and cost is reduced since plated solder having poor tolerances can be improved. The solder may be provided with defined thicknesses in the joining areas of leads. The top shape of the solder may be changed to increase yield. Where cavities are applied to the surface of the solder for receiving flux, less flux is needed for an effective joining process. The invention insures that adequate amounts of flux are available prior to and during the thermal joining cycle. This is particularly useful where solder has been electroplated onto printed circuit boards for receiving electronic components.

According to one feature of the invention, cavities are formed in the surface of solder which is plated onto components for subsequent use in joining other members to the components. Flux with its usual solvent is then supplied to the cavities. The cavities are formed with a pulse heated tool having the treatment surface with the selected shape so that when the treatment surface is brought into contact with the surface of the solder, the selected shape is transferred to the solder. In this way, the cavities are formed in the surface of the solder. The heated tool causes the solder to fuse at least at its surface. The tool is then allowed to cool so that the solder resolidifies before the tool is removed to retain the selected shape in the surface of the solder.

The material of the treatment surface is selected to be non-wettable by the fused solder so that no solder adheres to the treatment surface.

Flux can be applied to the cavities by various known technologies such as dripping, spraying and the like. Where solvent is used to dispense the flux, the solvent is caused to evaporate before any subsequent joining operation to insure that only solid flux remains in the cavities of the solder surface.

The surface of the solder can also be treated by the treatment surface by applied force to the tool for impressing the selected shape into the solder surface. A stop is connected to the tool for engagement with a substrate carrying the solder so that the treatment surface is stopped at a defined gap from the substrate.

Another feature of the present invention is to provide the treatment surface of the tool with a selected shape which is flat of planar for flattening or coining the surface of one or more solder areas on a substrate. In addition, the selected shape may include concave areas for producing convex shaped areas in the surface of the solder.

As with the embodiment of the invention for producing cavities in the surface of the solder, mechanically as well as thermally matched solder tools are used which are pulse heated for momentary fusing of the solder. The tools are moved toward and forced against the solder with their motion being controlled by mechanical stops for setting a mechanical tolerance in the thickness of the solder. One or more mechanical stops may be included which bear against the printed circuit board or other substrate which carries the solder areas. Preferably the mechanical stops are not heated and touch the circuit board or substrate at a location spaced from the solder areas. In this way, the stops may even engage temperature sensitive areas without causing damage.

Alternatively, the mechanical stops may be heated simultaneously with or at different times from the treatment surface to cause shaping of the solder. A portion of the treatment surface can be used as the stop. In this embodiment of the invention, force and heat is used to fuse the solder until at least some of the metalized surface supporting the solder is exposed and is engaged by the stop area of the treatment surface.

The surface of the solder can be shaped in three dimensions and in particular, in a manner for receiving components which are ultimately to be joined to the solder. Separation can also be achieved between adjacent solder pads to avoid solder bridging effects.

Another feature of the invention is to fuse a larger area of solder then is required for the later solder joining process. This can be required if, within the mounting area, the available solder is not sufficient to fill gaps which may be formed between the pulse heated tool and the surface of the solder. An additional thermal source may also be utilized for heating a wider area of solder. This may, for example, be a flow of heated gas. The flow of hot gas may also be directed for causing the solder to flow in a selected direction for reshaping the solder. The gas might also be used to produce different temperature areas to create thermal differences which cause the solder to flow according to its natural thermal expansion.

BRIEF DESCRIPTION OF THE DRAWINGS

In the drawings:

FIG. 5 is an elevational view of another embodiment of the invention;

FIG. 6 is a view similar to FIG. 5 of a further embodiment of the invention;

FIG. 7 is a view similar to FIG. 5 of a still further embodiment of the invention;

DESCRIPTION OF THE PREFERRED EMBODIMENTS

Figure 1:
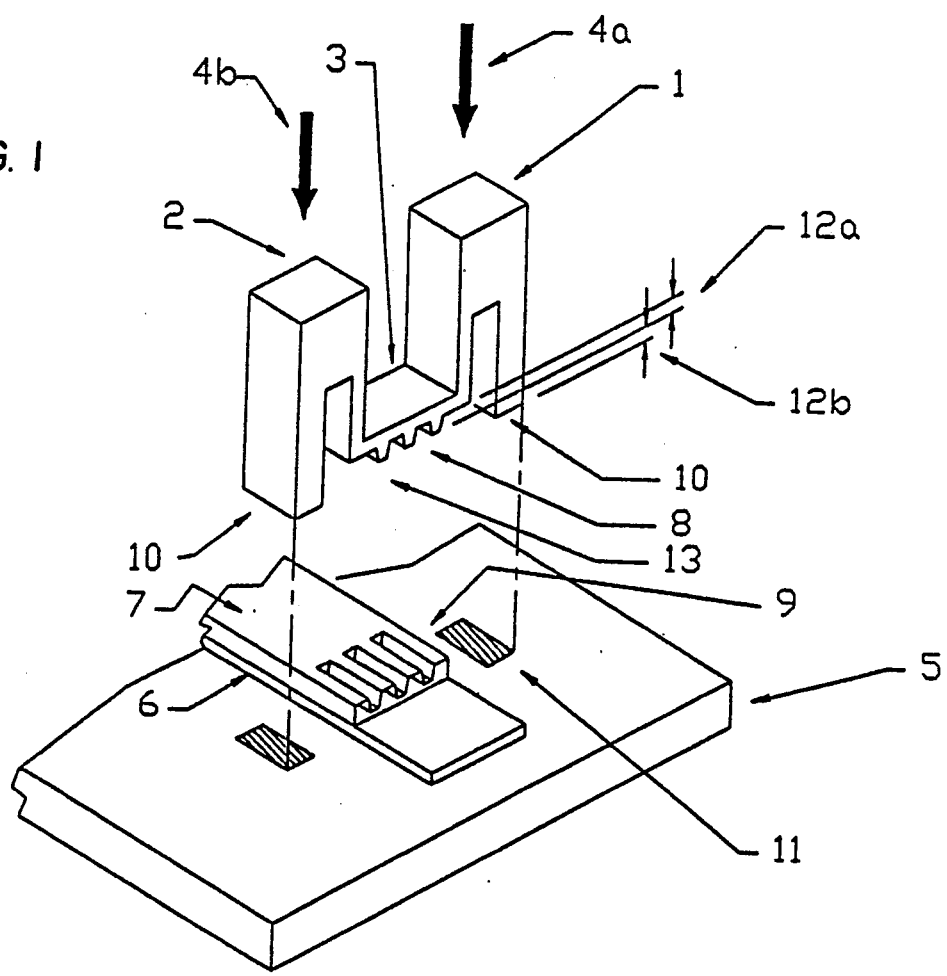
FIG. 1 is a perspective view of apparatus used to practice the present invention.

Referring to the drawings in particular, FIG. 1 illustrates a pulse heated tool having connectors 1 and 2 for receiving electrical current which passes through a heating portion 3 carrying a treatment surface 8 to be heated. Connectors 1 and 2 are also structures for receiving forces 4a and 4b for moving the tool toward and pressing the tool against a quantity of solder 7 which is plated onto a pad 6 fixed to a mechanical support or substrate 5. The cross sectional area of heating portion 3 is smaller than the cross sectional area of connectors 1 and 2 for increasing the temperature of the heating portion 3. This temperature is detected in a manner not shown and used to control the electrical current passing through the tool to reach a preset temperature.

Once a present force 4a and 4b is reached, the electrical current is turned on for heating the heated portion 3.

According to the present invention, the treatment surface 8 is not flat but rather includes a plurality of convex projections or ridges 13.

With the heated heating portion 3 in contact with the solder 7, the solder fuses so that grooves 9 are formed in the surface of the solder. The electrical energy is then disconnected to permit the tool to cool and allow the solder to resolidify. The material of the treatment surface 8 is selected to be non-wettable by the solder. In this way, when the tool is withdrawn from the solder, the solder with its shaped grooves or cavities 9 remain on the pad 6.

In order to prevent the grooves 9 from extending all the way to the pad 6, stops 10 are provided on opposite sides of the tool for mechanically engaging stop areas 11 on the substrate 5. The stops 10 extend beyond the treatment area by distances 12a and 12b which produce selected gaps between the various elevations of the treatment surface 8, and the surface of substrate 5. In this way solder 7 is precisely shaped within very close mechanical tolerances.

Flux can then be supplied into the grooves 9 for use in a subsequent process.

The force applied to the connectors 1 and 2 is also used in reshaping the solder. Heating of the treatment surface can be achieved before or after the tool is brought into contact with the solder.

Figure 2:
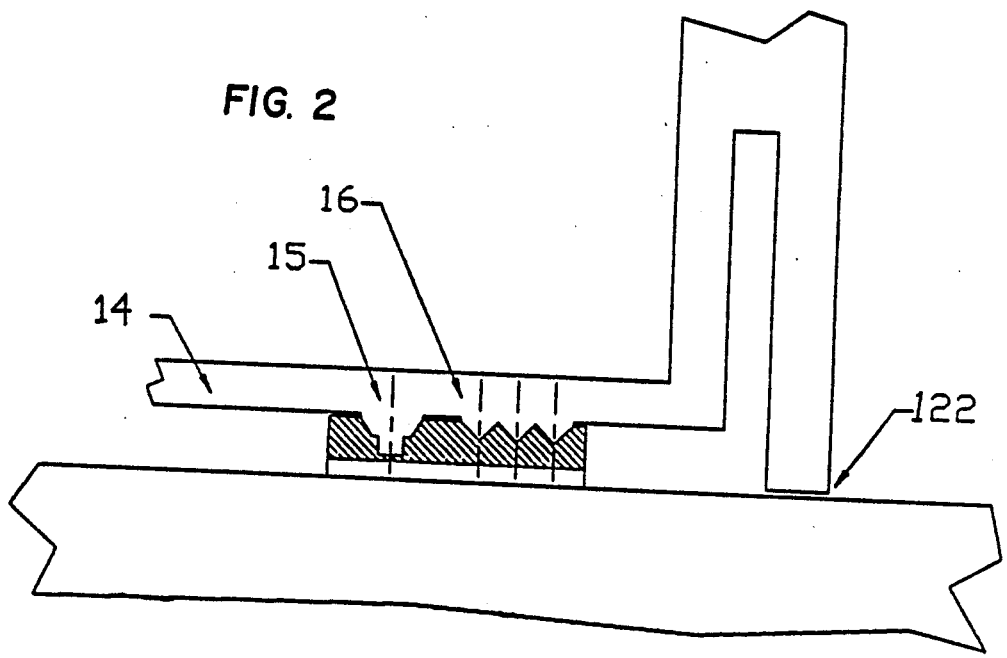
FIG. 2 is a sectional view of another embodiment of the invention for producing spaced cavities in the surface of a solder pad.

FIG. 2 illustrates a heated tool with a heated portion 14 having a plurality of conical projections 16 and a single pin shaped projection 15. This produces corresponding pin shaped and conical cavities in the surface of the solder. The depth is controlled by a stop 122 to prevent the tool from completely piercing the solder. Different flux materials can then be supplied to the different cavities which are separated from each other. This is particularly useful where high viscosity fluxes are involved.

Figure 3:
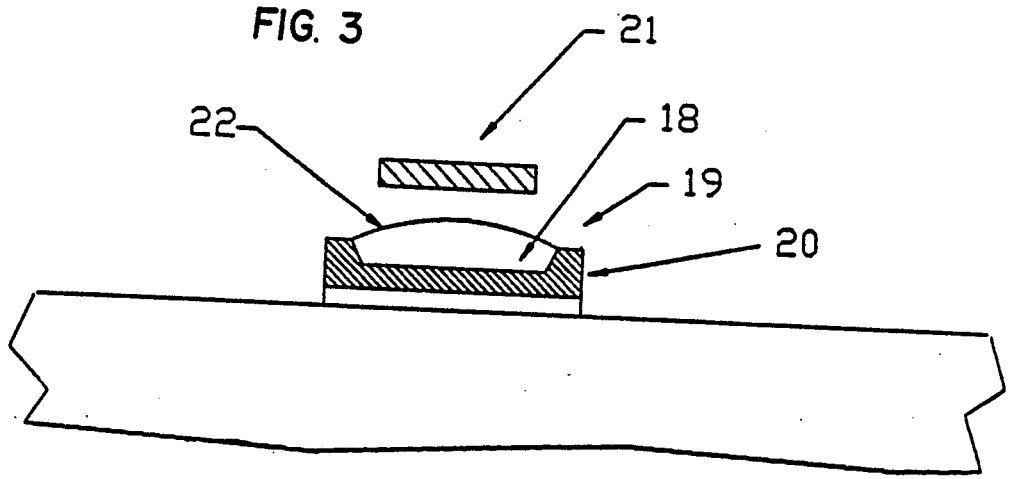
FIG. 3 is a sectional view showing a solder pad which has been reshaped according to the present invention for receiving a lead to be connected using the solder.

FIG. 3 shows another embodiment of the invention wherein a trough shaped recess 18 is formed to correspond roughly to the shape of a lead 21 which is to be joined to a pad on a circuit board using solder 20. Recess 18 is bound on opposite sides by a bar 19 of solder for confining the lead. The recess is filled with flux 22 for use during the soldering process.

Figure 4:
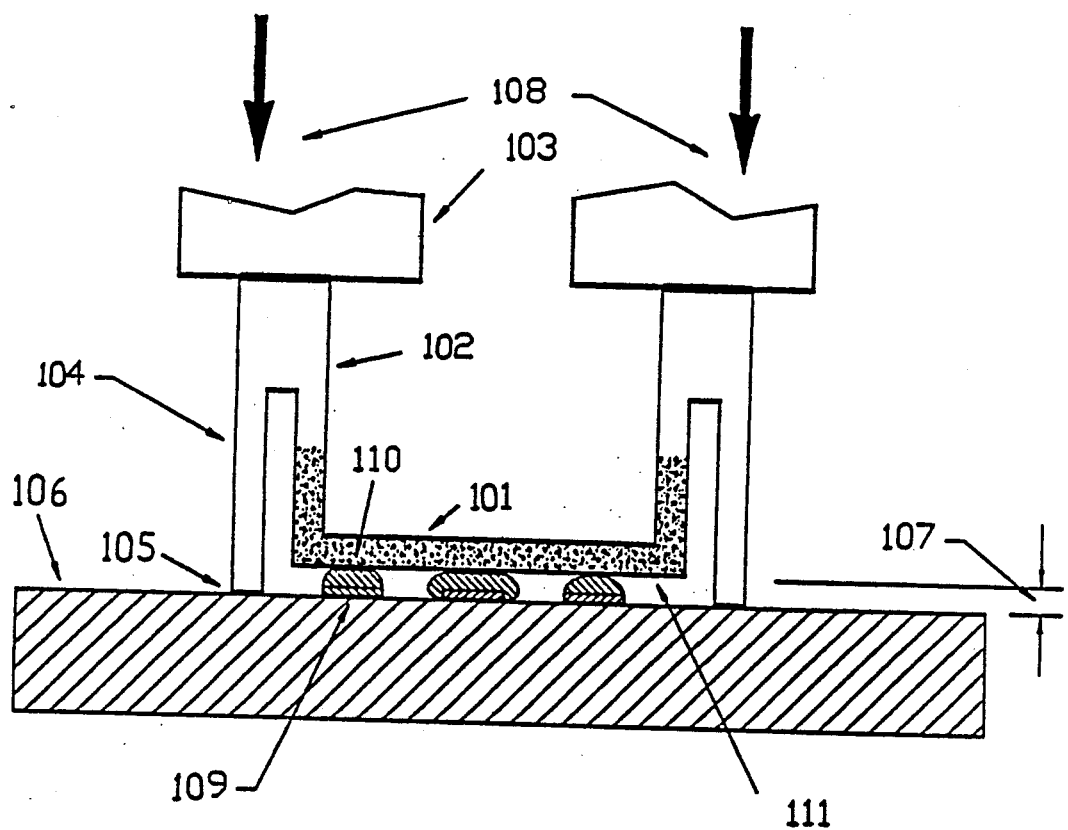
FIG. 4 is a side elevational view of apparatus used for practising a further embodiment of the present invention.

FIG. 4 illustrates an embodiment of the invention where the solder 110 on multiple pads 109 of a substrate 106 are to be coined or flattened using the heating bar 101 of a heated tool 102. Stops 104 are provided for contacting the substrate at 105 and for creating a selected gap 107 between the treatment surface 111 of the heating bar 101 and the substrate 106. Electrical energy is supplied through copper connectors 103 which are also used for applying force 108 to the tool. The stops 104 are purposely outside of the path of electricity through the heating bar 101 to avoid heating the stops. With electrical current flowing through the heating bar, and the heating bar being pressed by force 108 against the plated solder, the upper surfaces of the solder melt and are reformed with close tolerance. As with the embodiments of FIGS. 1, 2 and 3, the treatment surface 101 is made of material which is not wettable by the fused solder.

After the solder has been fused sufficiently, the electrical current is turned off to allow the tool to cool and permit the solder to resolidify and maintain its coined flat surface.

FIG. 5 shows an embodiment of the invention where the treatment surface has a concave area with a width 113 and a depth 112. A mechanical stop area 105 counteracts the downward force 108 which brings the treatment surface against the solder plated onto a pad held on a substrate. The recess in the treatment surface reshapes the plated solder to have an accurate convex contour which is advantageous for the subsequent solder joining process.

FIG. 6 shows another embodiment of the invention with a contoured channel 114 in the treatment surface for producing a corresponding shape on the surface of the solder.

FIG. 7 illustrates an embodiment of the invention where portions 115 of the treatment surface actually contact the pad and reshape the solder into a central area on the pad. Again, a stop 116 is formed to counteract the mechanical force applied to the tool. The stop 116 can be eliminated, however, since the stop areas 115 of the treatment surface set the downward position of the tool. The contact between the tool and the pad also increased the flow of thermal energy to the solder through the pad. Stop 116, where it is present, acts as an emergency stop to avoid damage to the pad.

Figure 8:
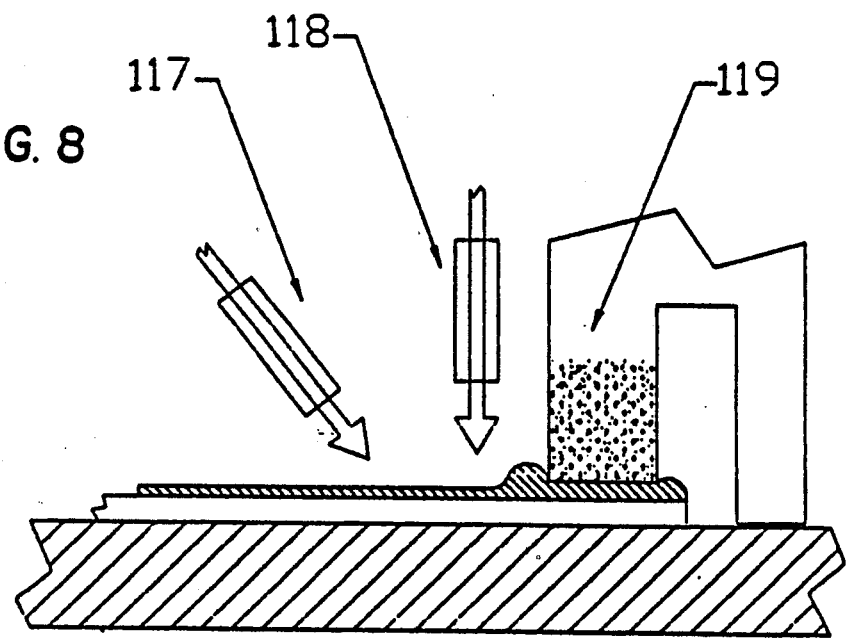
FIG. 8 is a view similar to FIG. 5 showing a still further embodiment of the invention which uses additional heat sources in the form of flowing gas.
Figure 9:
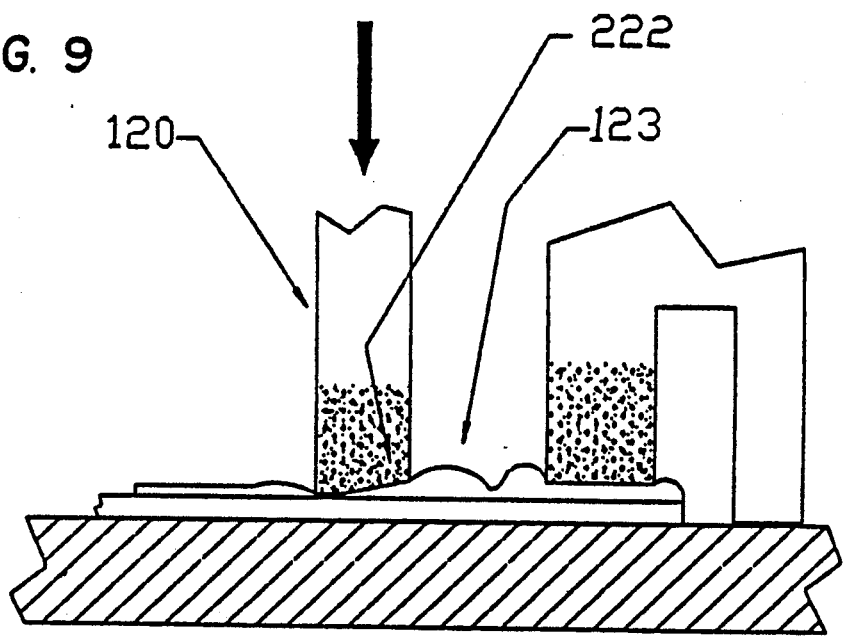
FIG. 9 is a view similar to FIG. 8 of a further embodiment of the invention using an additional heated tool for reshaping a solder surface.

FIG. 8 illustrates an embodiment of the invention where the heated portion 119 of the tool locally melts solder and flows of hot gas 117 and 118 are used to help redirect the fused solder. The fused solder also moves according to its surface tension and the heat produced by the tool 119. Solder can also be moved toward the heated tool as shown in FIG. 9 by using an additional heated bar 120 with an inclined contact area 222 which causes flow of the fused solder in area 123. Bar 120 can be heated to the same or different temperature from the heated tool to produce non-flat shapes in the surface of the solder.

I claim:

1. A process for treating the surface of a solid fusible material that is supported on a substrate, using a tool having a treatment surface with a selected shape and a stop surface extending beyond the treatment surface in a selected direction, the process comprising:

pulse heating the treatment surface to a temperature sufficiently high to fuse the fusible material;

moving the treatment surface in the selected direction toward the substrate and into contact with the surface of the fusible material to form the selected shape on the surface of the fusible material, the moving continuing until the stop surface engages the substrate to form a selected gap between the treatment surface and the substrate;

allowing the treatment surface to cool sufficiently so that the fusible material resolidifies while the treatment surface is in contact with the fusible material; and thereafter withdrawing the treatment surface from the substrate and from the surface of the fusible material.

2. A process according to claim 1 including heating the treatment surface before moving the treatment surface into contact with the fusible material.

3. A process according to claim 1 including heating the treatment surface after moving the treatment surface into contact with the fusible material.

4. A process according to claim 1 wherein the tool includes a stop for carrying the stop surface which extends beyond the treatment surface in the direction of movement of the treatment surface toward the substrate, the process including moving the stop into contact with the substrate at a location spaced from the fusible material to form a selected gap between the treatment surface and the substrate.

5. A process according to claim 1 wherein the treatment surface includes at least one convex projection so that a cavity is formed in the surface of the fusible material.

6. A process according to claim 5 wherein the fusible material comprises a solder, the process including introducing flux into the cavity.

7. A process according to claim 6 wherein the convex projection includes a cylindrical pin.

8. A process according to claim 6 wherein the convex projection is conical.

9. A process according to claim 6 wherein the convex projection comprises a ridge so that the cavity is in the form of a groove.

10. A process according to claim 5 wherein the treatment surface includes a plurality of spaced convex projections having different lengths in the direction of movement of the treatment surface toward the substrate, for forming a plurality of cavities having different depths, the cavities being separated from each other.

11. A process according to claim 1 including applying force to the tool for forcing the treatment surface against the surface of the fusible material.

12. A process according to claim 11 including releasing the force and withdrawing the tool only after the fusible material has resolidified.

13. A process according to claim 1 wherein the treatment surface is made of material that is not wettable by the fusible material when it is fused.

14. A process according to claim 1 including heating the treatment surface by passing electricity through the tool, the tool including a stop member spaced from the treatment surface through which no electricity passes, the stop member having an end extending beyond the treatment surface in the direction of movement of the treatment surface toward the substrate for engaging the substrate to stop movement of the treatment surface at the selected gap from the substrate.

15. A process according to claim 1 wherein the selected shape is flat for coining and flattening the surface of the fusible material.

16. A process according to claim 1 wherein the treatment surface includes at least one concave recess for producing a convex shape in the surface of the fusible material.

17. A process according to claim 16 wherein the fusible material comprises a solder which is plated onto a member supported on the substrate, the concave recess being shaped to receive the solder with portions of the treatment surface contacting the member and acting as the stop surface for stopping movement between the tool and the substrate.

18. A process according to claim 1 including applying a heated tool against the surface of the fusible material at a location spaced from the treatment surface for causing the fusible material to fuse and flow with respect to the treatment surface.

19. A process for treating the surface of a solid fusible material that is supported on a substrate, using a tool having a treatment surface with a selected shape, comprising:
   moving the treatment surface toward the substrate and into contact with the surface of the fusible material to form the selected shape on the surface of the fusible material;
   withdrawing the treatment surface from the substrate and from the surface of the fusible material;
   the treatment surface including at least one convex projection so that a cavity is formed in the surface of the fusible material, the convex projection being selected to have the shape of a member to be connected to the fusible material; and
   seating the member into the cavity and connecting the member to the substrate using the fusible material.

20. A process for treating the surface of a solid fusible material that is supported on a substrate, using a tool having a treatment surface with a selected shape, comprising:
   moving the treatment surface toward the substrate and into contact with the surface of the fusible material to form the selected shape on the surface of the fusible material;
   withdrawing the treatment surface from the substrate and from the surface of the fusible material;
   the tool including a stop which extends beyond the treatment surface in the direction of movement of the treatment surface toward the substrate, the stop engaging the substrate for holding the treatment surface at a selected gap from the substrate;
   heating the treatment surface to fuse the fusible material; and
   directing gas toward the fusible material after it has fused to cause the fusible material to flow with respect to the treatment surface.

* * * * *